(12) United States Patent
Lee et al.

(10) Patent No.: US 7,952,435 B2
(45) Date of Patent: May 31, 2011

(54) PHASE LOCKED LOOP AND METHOD FOR COMPENSATING TEMPERATURE THEREOF

(75) Inventors: Seung-Wook Lee, Seoul (KR); Joonbac Park, Seoul (KR); Jeong Woo Lee, Seoul (KR); Su Won Kang, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 11/976,912

(22) Filed: Oct. 29, 2007

(65) Prior Publication Data

US 2008/0252383 A1   Oct. 16, 2008

(30) Foreign Application Priority Data

Oct. 30, 2006   (KR) .................. 10-2006-0105461

(51) Int. Cl.
*H03L 7/00* (2006.01)
(52) U.S. Cl. .......... 331/16; 331/36 C; 331/66; 331/176; 331/179; 375/375; 375/376
(58) Field of Classification Search .............. 331/10, 331/15, 16, 23, 34, 36 R, 36 C, 66, 70, 175, 331/176, 177 V, 11, 14, 17, 18, 25, 179, 177 R; 375/375, 376
See application file for complete search history.

(56) References Cited

U.S. PATENT DOCUMENTS

| | | | |
|---|---|---|---|
| 3,694,766 A * | 9/1972 | Boelke | 331/11 |
| 6,476,682 B1 * | 11/2002 | Cole et al. | 331/176 |
| 6,545,547 B2 * | 4/2003 | Fridi et al. | 331/16 |
| 6,587,005 B2 * | 7/2003 | Ichihara | 331/16 |
| 6,838,951 B1 * | 1/2005 | Nieri et al. | 331/177 V |
| 7,116,183 B2 * | 10/2006 | Wu | 331/176 |
| 7,145,402 B2 * | 12/2006 | Mattila et al. | 331/66 |
| 7,312,664 B2 * | 12/2007 | Loke et al. | 331/16 |
| 2004/0232997 A1 * | 11/2004 | Hein et al. | 331/16 |
| 2005/0083137 A1 * | 4/2005 | Lee et al. | 331/16 |
| 2006/0077015 A1 * | 4/2006 | Fujita | 331/176 |
| 2006/0158264 A1 * | 7/2006 | Kousai et al. | 331/16 |
| 2006/0226916 A1 * | 10/2006 | Florescu et al. | 331/16 |
| 2007/0115069 A1 * | 5/2007 | Fujita et al. | 331/36 C |
| 2008/0002801 A1 * | 1/2008 | Droege et al. | 375/375 |
| 2008/0007365 A1 * | 1/2008 | Venuti et al. | 331/179 |

* cited by examiner

*Primary Examiner* — Arnold Kinkead
*Assistant Examiner* — Richard Tan
(74) *Attorney, Agent, or Firm* — Muir Patent Consulitng, PLLC

(57) ABSTRACT

Embodiments of a phase lock loop and a method for compensating a temperature thereof can output an initial tuning digital value for a voltage controlled oscillator configured to output a desired phase lock loop frequency compensated according to a temperature change. Embodiments of a phase lock loop and a method for compensating a temperature thereof can simultaneously perform a digital coarse tuning and an analog fine tuning to compensate for a temperature in a limited time.

12 Claims, 5 Drawing Sheets

PHASE LOCKED LOOP AND METHOD FOR COMPENSATING TEMPERATURE THEREOF

CROSS-REFERENCE TO RELATED APPLICATION

This application claims priority under 35 U.S.C. §119 (a) of Korean Patent Application No. 10-2006-0105461, filed on Oct. 30, 2006, in the Korean Intellectual Property Office, the disclosure of which is incorporated herein by reference in its entirety.

BACKGROUND OF THE INVENTION

1. Field of the Invention

The present general inventive concept relates to a phase lock loop and a method for compensating a temperature thereof.

2. Background of the Related Art

A phase locked loop (hereinafter referred to as "PLL") that generates a predetermined frequency from a reference frequency is widely used in various devices that generate a local oscillation frequency. The PLL includes a voltage controlled oscillator (hereinafter referred to as "VCO") that further amplifies an input noise as a gain thereof increases. In order to overcome the disadvantage, a technology for the VCO includes a plurality of capacitors that carries out a coarse tuning and a capacitor that carries out a fine tuning. For instance, U.S. Pat. No. 6,587,005 titled "PLL CIRCUIT HAVING A VARIABLE OUTPUT FREQUENCY" by NEC Corporation discloses the technology. In accordance with U.S. Pat. No. 6,587,005, a VCO includes an active element forming a negative feedback, four capacitors controlled digitally to perform out a coarse tuning, and analog control of one capacitor (varactor) to perform a fine tuning. In addition, a frequency control unit outputs a digital value for the coarse tuning by receiving numbers N and R transmitted to an R-divider and an N-divider and a tuning voltage being outputted from a loop filter.

The above references are incorporated by reference herein where appropriate for appropriate teachings of additional or alternative details, features and/or technical background.

SUMMARY OF THE INVENTION

An object of the present general inventive concept is to address at least the above problems and/or disadvantages or to provide at least the advantages and/or utilities described hereinafter in whole or in part.

Another object of the present invention is to provide a phase lock loop and a method that can perform a coarse tuning and a fine tuning to compensate for a temperature.

Another object of the present invention is to provide a phase lock loop and a method for compensating a temperature that can simultaneously perform a digital coarse tuning and an analog fine tuning to compensate for a temperature.

Another object of the application is to provide a phase lock loop and a method for compensating a temperature thereof including a phase locked loop comprises a VCO configured with a plurality of capacitors controlled by a tuning digital value and a capacitor controlled by a tuning capacitor such that the tuning digital value is varied according to a change in the temperature to compensate for the change in the temperature.

To achieve objects and/or utilities of embodiments of the application in whole or in part there is provided a phase locked loop that can include an R-divider to output a signal having a frequency obtained by dividing a frequency of an input signal by R, an N-divider to output a signal having a frequency obtained by dividing a phase locked loop output frequency by N, a phase detector to output a signal corresponding to a difference obtained by comparing a phase of the signal being outputted by the R-divider with a phase of the signal being outputted by the N-divider, a loop filter to output a tuning voltage having a high frequency component of the signal being outputted by the phase detector removed therefrom, a VCO to output a signal having the phase locked loop output frequency corresponding to the tuning voltage and a tuning digital value, a coarse tuning controller to output an initial tuning digital value corresponding to a desired phase locked loop output frequency and a temperature compensator to initially output the initial tuning digital value as the tuning digital value and to output a compensated initial tuning digital value compensated according to a temperature change as the tuning digital value when the temperature change occurs.

To also achieve objects and/or utilities of embodiments of the application in whole or in part there is provided a method for compensating a temperature of a phase locked loop configured with a VCO outputting a signal having a phase locked loop output frequency corresponding to a tuning digital value and a tuning voltage, the method can include (a) setting an initial tuning digital value corresponding to a desired phase locked loop output frequency, (b) converging the phase locked loop output frequency to the desired phase locked loop output frequency by varying the tuning voltage, (c) inputting a change to a lookup table storing a compensating digital value corresponding to the change in the temperature to compensate for the tuning digital value using the compensating digital value being outputted from the lookup table and (d) converging the phase locked loop output frequency to the desired phase locked loop output frequency by varying the tuning voltage.

To also achieve objects and/or utilities of embodiments of the application in whole or in part there is provided a method for compensating a temperature of a phase locked loop including a voltage controller oscillator outputting a signal having a phase locked loop output frequency based on a first and second variable capacitances, the method can include judging whether the phase locked loop output frequency is above a desired phase locked loop output frequency based on a tune voltage to control the first variable capacitance, correcting a control voltage corresponding to the desired phase locked loop output frequency to control the second variable capacitance based on the judging and compensating the corrected control voltage using a stored compensating digital value from a storage device corresponding to the change in the temperature.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF EMBODIMENTS

Exemplary embodiments according to the present general inventive concept will now be described in detail with reference to the accompanied drawings. The interpretations of the terms and wordings used in description and claims should not be limited to common or literal meanings. Exemplary embodiments of the application are provided to describe the application more thoroughly for those skilled in the art.

Figure 1:
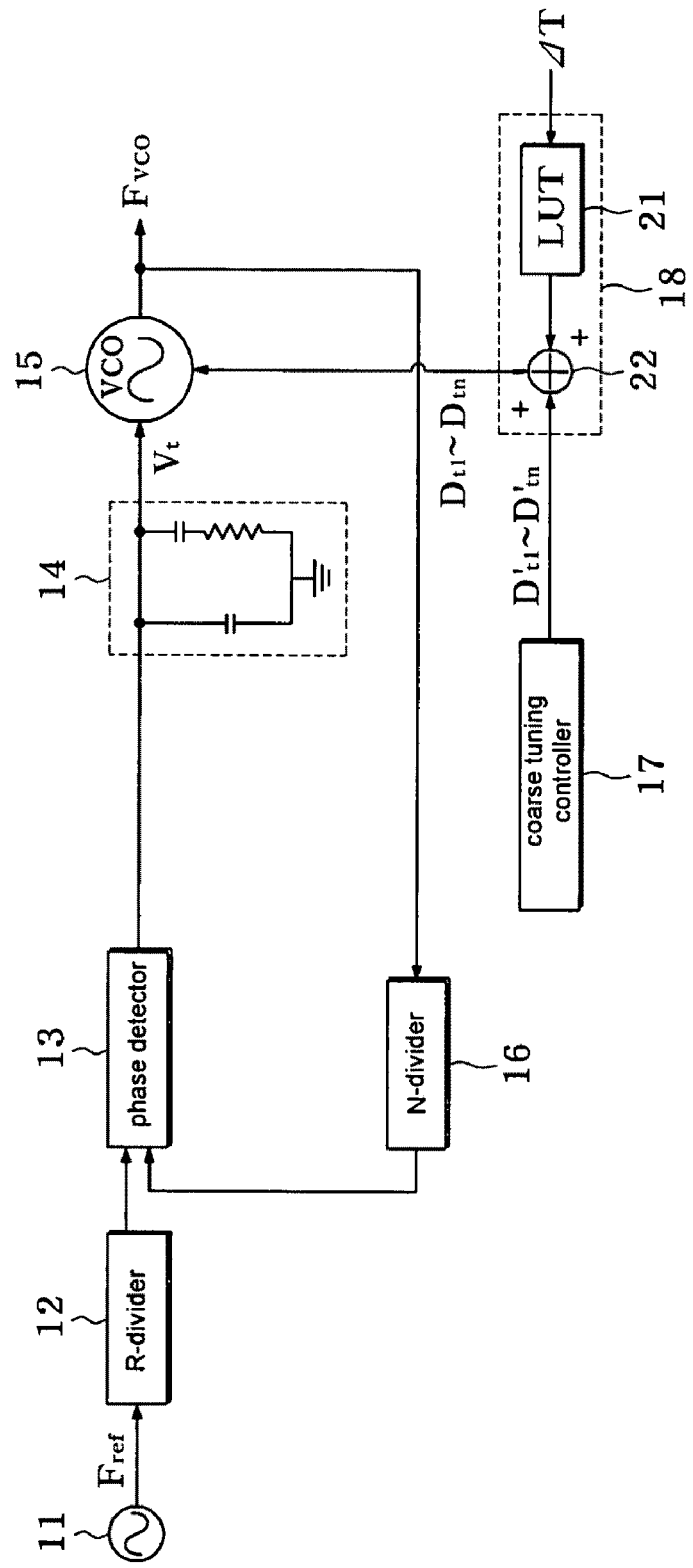
FIG. 1 is a diagram illustrating a phase lock loop in accordance with an embodiment of the application.

FIG. 1 is a diagram illustrating a phase lock loop in accordance with an embodiment of the application. As shown in FIG. 1, the PLL can include an R-divider 12, a phase detector 13, a loop filter 14, a VCO 15, an N-divider 16, a coarse tuning controller 17 and a temperature compensator 18.

The R-divider 12 can output a signal having a frequency obtained by dividing a frequency Fref (e.g., an output signal of an external crystal oscillator 11) by R. An output signal of the R-divider 12 preferably has the frequency of Fref/R.

The phase detector 13 outputs a signal corresponding to a difference obtained by comparing a phase of the signal being outputted by the R-divider 12 with a phase of a signal being outputted by the N-divider 16.

The loop filter 14 can output a tuning voltage Vt having a high frequency component of the signal being outputted by the phase detector 13 removed therefrom.

The VCO 15 can output a signal having a frequency $F_{VCO}$ corresponding to the tuning voltage Vt and tuning digital values Dt1 through Dtn. The frequency of the signal being outputted by the VCO 15 is referred to as a PLL output frequency $F_{VCO}$.

The N-divider 16 outputs a signal having a frequency obtained by dividing the PLL output frequency by N.

The coarse tuning controller 17 can output initial digital values Dt1' through Dtn' corresponding to a desired PLL output frequency. For instance, the coarse tuning controller 17 may have a structure identical to that of a frequency control unit shown in FIG. 8 of U.S. Pat. No. 6,587,005.

The temperature compensator 18 can initially output the initial tuning digital values Dt1' through Dtn' as the tuning digital values Dt1 through Dtn. When the change of the temperature occurs, the temperature compensator 18 preferably outputs the initial tuning digital values Dt1' through Dtn' being compensated according to the change ΔT in the temperature as the tuning digital value Dt1 through Dtn. In one embodiment in order to achieve this, the temperature compensator 18 can include a lookup table 21 that can output a compensating digital value corresponding to the change ΔT in the temperature and an adder 22 that outputs a sum of the compensating digital value and the initial tuning digital values Dt1' through Dtn' as the tuning digital values Dt1 through Dtn. Preferably, the lookup table 21 can output zero during an interval during which the coarse tuning controller 17 sets (e.g., the initial tuning digital values Dt1' through Dtn'), and can output the compensating digital value corresponding to the change ΔT in the temperature thereafter.

The PLL shown in FIG. 1 may change the tuning digital value according to the change in the temperature and maintain the VCO output frequency $F_{VCO}$ as the desired frequency by compensating for the change in the temperature.

In contrast however, the technology disclosed by U.S. Pat. No. 6,587,005 does not identify nor address problems caused by temperature variation, for example, variation of a capacitance by the change in the temperature after a PLL output frequency converges to a desired frequency. Further, the technology disclosed by U.S. Pat. No. 6,587,005 does not refer to how to control the four capacitors when the change of the digital value controlling on/off of the four capacitors due to a variation of a capacitance by the change in the temperature after a PLL output frequency converges to a desired frequency. More specifically, since the capacitance changes as the temperature changes, a voltage controlling the capacitance of the varactor should be changed in order to maintain the PLL output frequency. The tuning digital value controlling on/off of the four capacitors should also be changed if necessary. However, the conventional technology fails to disclose a method for changing the tuning digital value. Therefore, when the change in the temperature occurs, the capacitance of the VCO is changed such that the PLL cannot maintain the PLL output frequency.

Figure 2:
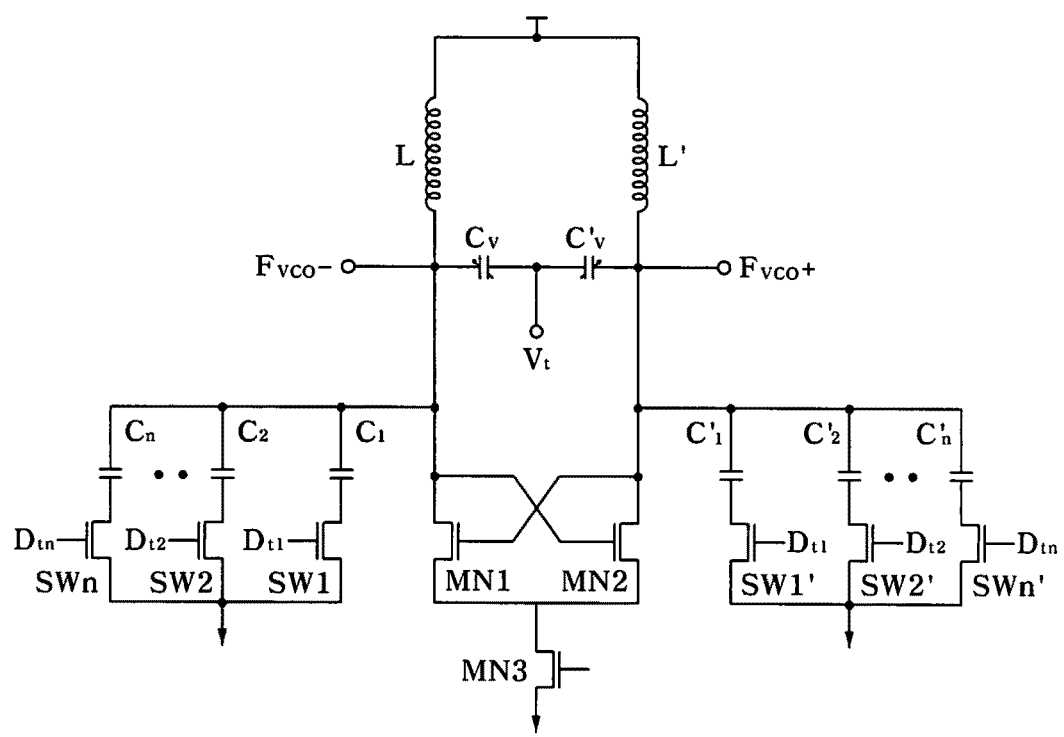
FIG. 2 is a diagram illustrating an example of a voltage controlled oscillator shown in FIG. 1 wherein a VCO circuit of a differential structure is shown.

FIG. 2 is a diagram illustrating an example of the VCO shown in FIG. 1. As shown in FIG. 2, an exemplary VCO circuit has a differential structure.

Referring to FIG. 2, the VCO can include inductors L and L', variable capacitors Cv and Cv', a plurality of switched capacitors C1/SW1 through Cn/SWn and C1'/SW1' through Cn'/SWn' and active elements MN1, MN2 and MN3.

The inductors L and L' have a fixed inductance. The variable capacitors Cv and Cv' have capacitance corresponding to the tuning voltage Vt. The plurality of switched capacitors C1/SW1 through Cn/SWn and C1'/SW1' through Cn'/SWn' forms an LC resonance circuit with the inductors L and L' and the variable capacitors Cv and Cv', and turns on or off switches SW1 through SWn and SW1' through SWn' according to the tuning digital values Dt1 through Dtn to discretely vary a capacitance thereof. For example, C2 can have a capacitance two times larger than that of C1, C3 can have a capacitance two times larger than that of C2, and Cn can have a capacitance two times larger than that of Cn−1. Of the active elements, the active elements MN1 and MN2 form a negative feedback to operate as a negative resistor and provide a power in order to maintain a continuous resonance of the LC resonance circuit. Of the active elements, the active element MN3 provides a current bias to the resonance circuit.

Figure 3:
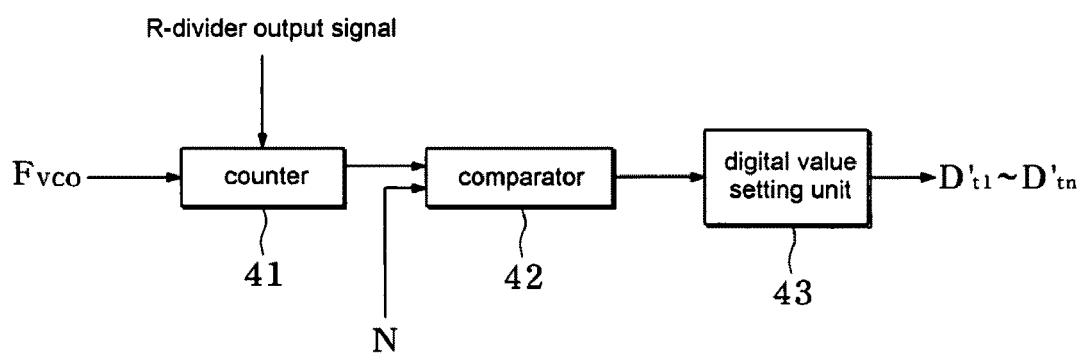
FIG. 3 is a diagram illustrating an example of a coarse tuning controller shown in FIG. 1.

FIG. 3 is a diagram illustrating an example of a the coarse tuning controller that can be used for the coarse tuning controller shown in FIG. 1. As shown in FIG. 3, the coarse tuning controller can include a counter 41, a comparator 42 and a digital value setting unit 43.

The counter 41 can repeatedly count a number of clocks of the signal being outputted by the VCO 15 during a predetermined period. In case of the counter 41 shown, the counter is reset for every rising edge of the output signal of the R-divider 12 to count the number of clocks of the signal being outputted by the VCO 15 during an interval corresponding to one period of the output signal of the R-divider.

The comparator 42 can output a result of a comparison between the number of clocks and a predetermined number. When the counter 41 carries out a counting during the interval corresponding to one period of the output signal of the R-divider, the comparator 42 outputs a result of a comparison between the output of the counter 41 and the number N inputted to the N-divider. When the output of the counter 41 is smaller than N, it represents the PLL output frequency $F_{VCO}$ is lower than the desired frequency, and when the output of the counter 41 is larger than N, it represents the PLL output frequency $F_{VCO}$ is higher than the desired frequency.

The digital value setting unit 43 can set the initial tuning digital values Dt1' through Dtn' according to the output of the comparator 42.

When n is 4 and the capacitance of the VCO increases as the digital value increases, the coarse tuning controller shown may operate as follows.

After the digital value setting unit 43 sets (Dt4', Dt3', Dt2', Dt1') to (1, 0, 0, 0), the counter 41 and the comparator 42 can operate to receive the output of the comparator 42. When the output of the comparator 42 representing that the PLL output frequency $F_{VCO}$ is higher than the desired frequency is inputted, the digital value setting unit 43 changes the initial tuning digital value to (1, 1, 0, 0) to increase the capacitance in order to lower the PLL output frequency $F_{VCO}$. Contrarily, when the output of the comparator 42 representing that the PLL output frequency $F_{VCO}$ is lower than the desired frequency is inputted, the digital value setting unit 43 changes the initial tuning digital value to (0, 1, 0, 0) to decrease the capacitance in order to raise the PLL output frequency $F_{VCO}$. Through such processes, Dt4' can be determined to be 1 or 0.

Thereafter, a process for determining Dt3' can be carried out. When the digital value setting unit 43 changes (Dt4', Dt3', Dt2', Dt1') to (0, 1, 0, 0), the counter 41 and the comparator 42 are operated to receive the output of the comparator 42. When the output of the comparator 42 representing that the PLL output frequency $F_{VCO}$ is higher than the desired frequency is inputted, the digital value setting unit 43 changes the initial tuning digital value to (1, 1, 1, 0) to increase the capacitance in order to lower the PLL output frequency $F_{VCO}$. Contrarily, when the output of the comparator 42 representing that the PLL output frequency $F_{VCO}$ is lower than the desired frequency is inputted, the digital value setting unit 43 changes the initial tuning digital value to (1, 0, 1, 0) to decrease the capacitance in order to raise the PLL output frequency $F_{VCO}$. Through such processes, Dt3' can determined to be 1 or 0.

Similarly, a process for selecting lower bits can be repeated to set the initial tuning digital values Dt1' through Dtn'. During a period for setting the initial tuning digital value, the temperature compensator 18 preferably generates an output by adding the initial tuning digital values Dt1' through Dtn' to zero. In addition, although not shown, during the period for setting the initial tuning digital value, a predetermined voltage may be inputted to the VCO 15 instead of the tuning voltage being outputted from the loop filter 14.

Figure 4:
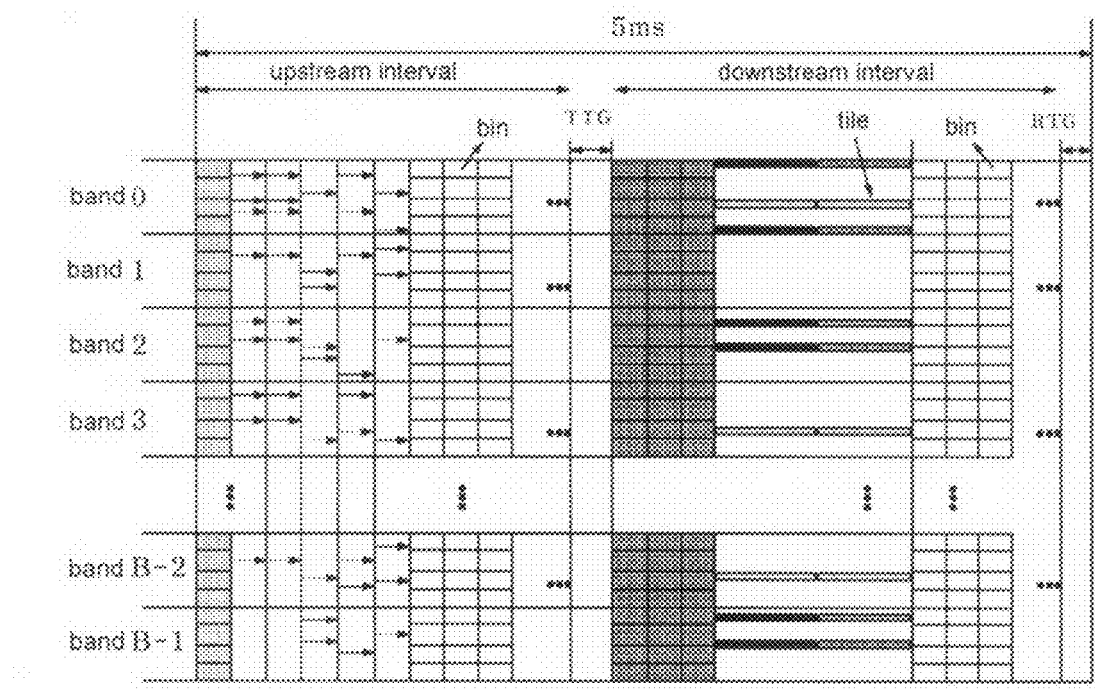
FIG. 4 is a diagram illustrating a timing at which a temperature compensator changes tuning digital values Dt1 through Dtn according to a temperature change ΔT, e.g., an update time in case of Wibro (wireless broadband) OFDMA (orthogonal frequency division multiple access) TDD (time division duplexing) frame.

FIG. 4 is a diagram illustrating a timing at which a temperature compensator can change tuning digital values Dt1 through Dtn according to the temperature change ΔT, e.g., an update timing in case of Wibro (wireless broadband), OFDMA (orthogonal frequency division multiple access), or TDD (time division duplexing) frame.

As shown in FIG. 4, a frame of 5 ms can include a downstream interval, an upstream interval, a TTG (Tx/Rx transition gap) positioned between the downstream interval and the upstream interval, and an RTG (Rx/Tx transition gap) positioned between a frame end and a frame start.

Since a transmission or a reception can be carried out during the downstream interval and the upstream interval, the PLL should remain stable. Therefore, during these intervals, the tuning digital values Dt1 through Dtn should not be changed. For example, even when a large change in the temperature occurs, the tuning digital values Dt1 through Dtn being outputted from the temperature compensator 18 should be constantly maintained. Since the transmission and the reception are not carried out during the TTG and RTG (e.g., other than the downstream interval and the upstream interval), the tuning digital values Dt1 through Dtn may be changed. Therefore, the tuning digital values Dt1 through Dtn should be changed according to the change ΔT in the temperature. For example, the lookup table 21 may carry out an update during the TTG and the RTG.

For instance, the TTG may be 121.1 μs or 87.2 μs, and RTG may be 40.4 μs or 74.4 μs or the like. Therefore, since the tuning voltage Vt should be changed according to the change of the tuning digital values Dt1 through Dtn as well as the tuning digital values Dt1 through Dtn being changed according to the change ΔT in the temperature during a very short period, the PLL using the proposed lookup table 21 is suitable. More specifically, when the PLL does not include the temperature compensator 18 and re-operates the coarse tuning controller 17 to reflect the change in the temperature, the coarse tuning controller 17 should sequentially determine the tuning digital values Dt1 through Dtn. In this case, a long time is required for determining the tuning digital values Dt1 through Dtn. When the long time is required for determining the tuning digital values Dt1 through Dtn, the PLL output frequency $F_{VCO}$ may not converge to the desired frequency within a limited TTG or RTG time. In contrast and in accordance with embodiments of the application, since the tuning digital values Dt1 through Dtn can be immediately changed according to the change ΔT in the temperature (e.g., using the lookup table), the change ΔT in the temperature can be appropriately compensated as well as the PLL output frequency $F_{VCO}$ being converged to the desired frequency within the limited time.

Figure 5:
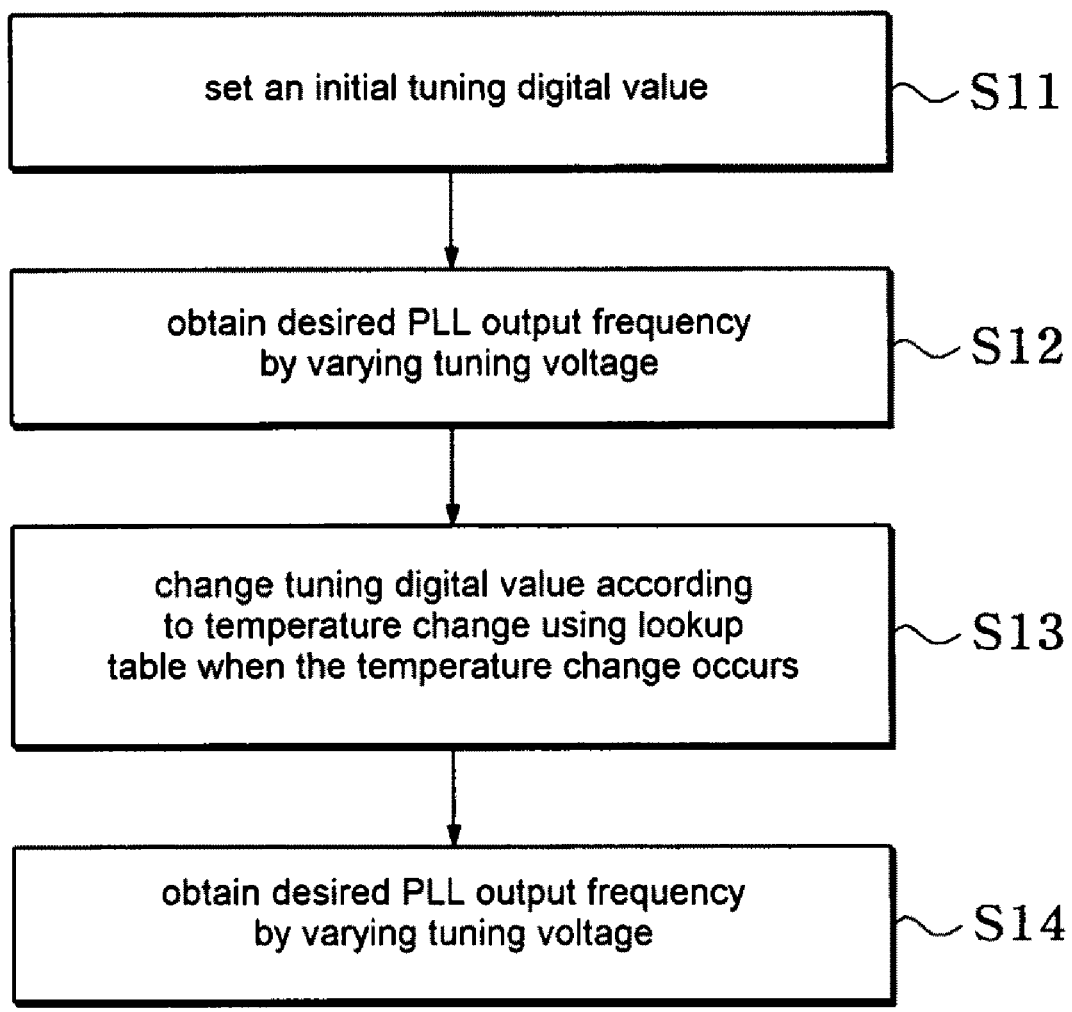
FIG. 5 is a diagram illustrating a method for compensating a temperature of a phase lock loop in accordance with an embodiment of the application.

FIG. 5 is a diagram illustrating a method for compensating a temperature of a phase lock loop in accordance with an embodiment of the application.

As shown in FIG. 5, the initial tuning digital values Dt1 through Dtn can be set (operation block S11). The initial tuning digital values (first tuning) may be set using a scheme shown in FIG. 8 of U.S. Pat. No. 6,587,005, the scheme shown in FIG. 3 of the application or the like. For example, after counting a number of clocks of the signal being outputted by the VCO during a predetermined period, the number of clocks of the signal being outputted by the VCO is compared to the predetermined number to set the value of one bit of the initial tuning digital value according to the result of the comparison. Such processes can be repeated until an entirety of the initial tuning digital value is set.

Thereafter, the tuning voltage Vt can be varied to obtain the desired PLL output frequency $F_{VCO}$ (operation block S12). After the tuning voltage Vt converges, the PLL output frequency $F_{VCO}$ can have a value of Fref×(N/R). Once the VCO output frequency $F_{VCO}$ converges, the transceiver including the PLL may carry out a normal transceiving.

Thereafter, the tuning digital values Dt1 through Dtn are required to be changed because of the change ΔT in the temperature, and the tuning digital values Dt1 through Dtn are changed (second tuning) according to the change ΔT in the temperature using the lookup table 21 (operation block S13). For example, the change in the temperature is inputted to the lookup table storing the compensating digital value corresponding to the change in the temperature to output the compensating digital value corresponding thereto, and the tuning digital value is compensated using the outputted compensating digital value. Preferably the tuning digital values Dt1 through Dtn should not be changed during the transmission or the reception, and the change in the tuning digital values Dt1 through Dtn should be carried out during non-transmission intervals (e.g., the TTG and RTG other than the downstream interval and the upstream interval illustrated in FIG. 4).

Thereafter, when the tuning digital values Dt1 through Dtn are changed, the tuning voltage Vt can be changed accordingly such that the PLL outputs the desired PLL output frequency $F_{VCO}$ (operation block S14). Preferably for instance, the tuning voltage Vt should also converge during the TTG and RTG other than the downstream interval and the upstream interval.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

As described above, embodiments of apparatuses, phase lock loops and the method for compensating the temperature thereof have various advantages. Embodiments can maintain an output frequency of the PLL substantially constant despite the change in the temperature, for example, since the tuning digital value may be changed according to the change in the temperature.

Moreover, embodiments of a phase lock loop and a method for compensating the temperature thereof can adjust the tuning digital value and the tuning voltage according to the change in the temperature within the limited time.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. As used in this disclosure, the term "preferably" is non-exclusive and means "preferably, but not limited to." Terms in the claims should be given their broadest interpretation consistent with the general inventive concept as set forth in this description. For example, the terms "coupled" and "connect" (and derivations thereof) are used to connote both direct and indirect connections/couplings. As another example, "having" and "including", derivatives thereof and similar transitional terms or phrases are used synonymously with "comprising" (i.e., all are considered "open ended" terms)—only the phrases "consisting of" and "consisting essentially of" should be considered as "close ended". Claims are not intended to be interpreted under 112 sixth paragraph unless the phrase "means for" and an associated function appear in a claim and the claim fails to recite sufficient structure to perform such function.

What is claimed is:

1. A phase locked loop comprising:
   an R-divider configured to output a signal having a frequency obtained by dividing a frequency of an input signal by R;
   an N-divider configured to output a signal having a frequency obtained by dividing a phase locked loop output frequency by N;
   a phase detector configured to output a signal corresponding to a difference obtained by comparing a phase of the signal being outputted by the R-divider with a phase of the signal being outputted by the N-divider;
   a loop filter configured to output a tuning voltage having a high frequency component of the signal being outputted by the phase detector removed therefrom;
   a VCO configured to output a signal having the phase locked loop output frequency corresponding to the tuning voltage and a tuning digital value, wherein the VCO comprises:
     an inductor;
     a variable capacitor configured to vary a capacitance according to the tuning voltage;
     a plurality of switched capacitors configured to form an LC resonance circuit with the inductor and the variable capacitor, the plurality of switched capacitors configured to discretely vary a capacitance according to the tuning digital value; and
     an active element configured to maintain the LC resonance circuit to resonate continuously;
   a coarse tuning controller configured to output an initial tuning digital value corresponding to a desired phase locked loop output frequency; and
   a temperature compensator configured to initially output the initial tuning digital value as the tuning digital value and to output a compensated digital value compensated according to a temperature change as the tuning digital value to vary the capacitance when the temperature change occurs,
   wherein the temperature compensator comprises:
     a lookup table configured to output the compensated digital value; and
     a logic circuit configured to output a combination of the compensated digital value and the initial digital value as the tuning digital value, and
   wherein the phase locked loop is configured to send and receive data in frames that each include an upstream interval, a downstream interval, a first gap interval between the upstream interval and downstream interval, and a second gap interval between a downstream interval end and an upstream interval start;
   wherein the lookup table is configured to change the compensating digital value either during the first gap interval or during the second gap interval, and
   wherein the frames are one of Wibro (wireless broadband), OFDMA (orthogonal frequency division multiple access) or TDD (time division duplexing) frames, and the temperature compensator is configured to determine the compensating digital value and the tuning digital value in less than 150 μsec.

2. The phase locked loop in accordance with claim 1, wherein the logic circuit comprises an adder for outputting a sum of the compensating digital value and the initial tuning digital value as the tuning digital value.

3. The phase locked loop in accordance with claim 1, wherein the temperature compensator is configured to determine the compensating digital value and the tuning digital value in a time period that is less than 10 percent of the length of the frame.

4. The phase locked loop in accordance with claim 1, wherein the coarse tuning controller comprises:
- a counter configured to count a number of clocks of the signal output by the VCO during a predetermined period;
- a comparator configured to output a result of a comparison between the number of clocks and a predetermined number; and
- a digital value setting unit configured to set the initial tuning digital value according to the output of the comparator.

5. The phase locked loop in accordance with claim 1, wherein the lookup table is configured to change the compensating digital value during the first gap interval.

6. A method for compensating a temperature of a phase locked loop including a voltage controlled oscillator (VCO) outputting a signal having a phase locked loop output frequency corresponding to a tuning digital value and a tuning voltage, the method comprising:
- (a) setting an initial tuning digital value corresponding to a desired phase locked loop output frequency;
- (b) converging the phase locked loop output frequency to the desired phase locked loop output frequency by varying the tuning voltage;
- (c) inputting a change to a lookup table storing a compensating digital value corresponding to the change in the temperature to compensate for the tuning digital value using the compensating digital value being outputted from the lookup table; and
- (d) converging the phase locked loop output frequency to the desired phase locked loop output frequency by varying the tuning voltage, wherein the step (d) is carried out during an interval of processing a data frame other than an upstream interval of the frame and a downstream interval of the frame, the interval being less than 10 percent of the length of the frame, wherein the step (a) comprises:
  - (a1) counting a number of clocks of the signal being outputted by the VCO during a predetermined period;
  - (a2) comparing the number of clocks obtained in the step (a1) to a predetermined number;
  - (a3) setting a value of one bit of the initial tuning digital value according to a result of the comparison; and
  - (a4) repeating the steps (a1) through (a3) until an entirety of the initial tuning digital value is set.

7. The method in accordance with claim 6, wherein the step (d) is carried out during a gap interval between an upstream interval of the frame and a downstream interval of the frame.

8. A method for compensating a temperature of a phase locked loop including a voltage controller oscillator outputting a signal having a phase locked loop output frequency based on a first and second variable capacitances, the method comprising:
- judging whether the phase locked loop output frequency is above a desired phase locked loop output frequency based on a tune voltage to control the first variable capacitance;
- correcting a control voltage corresponding to the desired phase locked loop output frequency to control the second variable capacitance based on the judging;
- compensating the corrected control voltage using a stored compensating digital value from a storage device corresponding to the change in the temperature, and
- setting the control voltage to an initial tuning digital value for the second variable capacitance corresponding to the desired phase locked loop output frequency,
- wherein first setting a digital tuning value for the second variable capacitance comprises said correcting, wherein second setting a digital tuning value for the second variable capacitance comprises said compensating the corrected control value, wherein said second setting a digital tuning value is performed during processing of a frame in a frame interval, said second setting a digital tuning value is performed during processing of the frame other than an upstream interval of the frame and a downstream interval of the frame, and is performed in a time period that is less than 10 percent of the length of the frame.

9. The method in accordance with claim 8, wherein the setting the control voltage to an initial tuning digital value comprises:
- counting a number of clocks of the signal being outputted by the voltage controller oscillator during a predetermined period;
- comparing the number of clocks obtained to a predetermined number;
- setting a value of one bit of the initial tuning digital value according to a result of the comparison; and
- repeating the counting, the comparing and the setting a value of one bit until the initial tuning digital value is set.

10. The method in accordance with claim 9, wherein said second setting a digital tuning value is performed in less than 150 μsec.

11. The method in accordance with claim 9, comprising:
- converging the phase locked loop output frequency to the desired phase locked loop output frequency by varying the tune voltage for the first variable capacitance.

12. The method in accordance with claim 8, wherein the second setting a digital tuning value is performed during processing of a gap interval between an upstream interval of the frame and a downstream interval of the frame.

* * * * *